United States Patent
Lee

(10) Patent No.: US 10,606,511 B2
(45) Date of Patent: Mar. 31, 2020

(54) NONVOLATILE MEMORY MODULES AND ELECTRONIC DEVICES HAVING THE SAME

(71) Applicant: Samsung Electronics Co., Ltd., Suwon-si, Gyeonggi-do (KR)

(72) Inventor: Kwang-Jin Lee, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/297,562

(22) Filed: Oct. 19, 2016

(65) Prior Publication Data

US 2017/0147262 A1     May 25, 2017

(30) Foreign Application Priority Data

Nov. 19, 2015  (KR) .......................... 10-2015-0162627

(51) Int. Cl.
| | | |
|---|---|---|
| *G06F 3/06* | (2006.01) | |
| *G06F 11/10* | (2006.01) | |
| *G11C 29/52* | (2006.01) | |
| *G11C 29/00* | (2006.01) | |
| *G11C 29/04* | (2006.01) | |

(52) U.S. Cl.
CPC ............ *G06F 3/0659* (2013.01); *G06F 3/064* (2013.01); *G06F 3/0604* (2013.01); *G06F 3/0619* (2013.01); *G06F 3/0679* (2013.01); *G06F 11/1044* (2013.01); *G06F 11/1068* (2013.01); *G11C 29/52* (2013.01); *G11C 29/70* (2013.01); *G11C 2029/0411* (2013.01)

(58) Field of Classification Search
CPC .............. G06F 11/1076; G06F 11/1008; G06F 11/106; G06F 3/0659; G06F 11/1044; G06F 3/0604; G06F 3/0679; G06F 3/064; G06F 3/0619; G06F 11/1068; H05K 999/99; G11C 2029/0411; G11C 29/52; G11C 29/70
USPC ........................................................ 714/764
See application file for complete search history.

(56) References Cited

U.S. PATENT DOCUMENTS

| | | | |
|---|---|---|---|
| 6,070,262 A | | 5/2000 | Kellogg et al. |
| 7,292,950 B1 * | | 11/2007 | Resnick .............. G06F 11/1044 700/1 |
| 7,679,133 B2 | | 3/2010 | Son et al. |
| 8,151,173 B2 | | 4/2012 | Hirose et al. |

(Continued)

FOREIGN PATENT DOCUMENTS

| | | |
|---|---|---|
| JP | 1994-110791 A | 4/1994 |
| KR | 0644223 B | 11/2006 |

*Primary Examiner* — Samir W Rizk
*Assistant Examiner* — Enam Ahmed
(74) *Attorney, Agent, or Firm* — Harness, Dickey & Pierce, P.L.C.

(57) ABSTRACT

A nonvolatile memory module including a plurality of memory chips, a spare chip, and a module controller may be provided. The plurality of memory chips may be disposed on a printed circuit board (PCB), and each of the plurality of memory chips may include a plurality of nonvolatile memory cells. The spare chip may be disposed on the PCB and includes a plurality of nonvolatile memory cells. The spare chip may perform different functions according to operation modes of the plurality of memory chips. The module controller may disposed on the PCB, and control operations of the plurality of memory chips and the spare chip.

13 Claims, 14 Drawing Sheets

(56) References Cited

U.S. PATENT DOCUMENTS

| | | | |
|---|---|---|---|
| 8,245,101 B2 * | 8/2012 | Olbrich | G06F 13/1657 |
| | | | 714/6.24 |
| 8,386,885 B1 | 2/2013 | Khan | |
| 8,553,466 B2 | 10/2013 | Han et al. | |
| 8,559,235 B2 | 10/2013 | Yoon et al. | |
| 8,654,587 B2 | 2/2014 | Yoon et al. | |
| 8,738,991 B2 | 5/2014 | Flynn et al. | |
| 8,982,619 B2 | 3/2015 | Strasser et al. | |
| 9,432,298 B1 * | 8/2016 | Smith | H04L 49/9057 |
| 2003/0106010 A1 | 6/2003 | Fujioka et al. | |
| 2007/0133331 A1 | 6/2007 | Park et al. | |
| 2009/0113272 A1 | 4/2009 | Tan et al. | |
| 2009/0240873 A1 * | 9/2009 | Yu | G06F 3/0608 |
| | | | 711/103 |
| 2013/0268728 A1 | 10/2013 | Ramanujan et al. | |
| 2014/0192583 A1 * | 7/2014 | Rajan | G11C 7/10 |
| | | | 365/63 |
| 2014/0317469 A1 * | 10/2014 | Sohn | G11C 29/848 |
| | | | 714/764 |
| 2015/0179285 A1 * | 6/2015 | Kilmer | G11C 29/70 |
| | | | 365/200 |

* cited by examiner

NONVOLATILE MEMORY MODULES AND ELECTRONIC DEVICES HAVING THE SAME

CROSS-REFERENCE TO RELATED APPLICATION(S)

This application claims priority under 35 USC § 119 to Korean Patent Application No. 10-2015-0162627, filed on Nov. 19, 2015 in the Korean Intellectual Property Office (KIPO), the contents of which are herein incorporated by reference in their entirety.

BACKGROUND

1. Technical Field

Example embodiments relate to semiconductor memory devices, and more particularly to nonvolatile memory modules and/or electronic devices including the nonvolatile memory module.

2. Description of the Related Art

Semiconductor memory devices for storing data may be classified into, for example, volatile memory devices and nonvolatile memory devices. The volatile memory devices are typically configured to store data by charging or discharging capacitors in memory cells, and are widely used as main memories of various apparatuses. The volatile memory devices such as Dynamic Random Access Memory (DRAM) and Static Random Access Memory (SRAM) retain stored data while power is supplied and lose the stored data when power is off.

The non-volatile memory devices such as flash memory devices may maintain stored data even though power is off, and are widely used for storing program codes and/or data in computers, mobile devices, etc.

According to demands for higher memory capacity, faster operation speed and lower power consumption of the memory devices, new memory devices of various types have been developed to realize high integration density of DRAM, fast speed of SRAM and non-volatility of flash memory in a single memory device. For example, Phase Change Random Access Memory (PRAM) using phase change materials, Resistance Random Access Memory (RRAM) using materials having variable resistance such as transition-metal oxides, and Magnetic Random Access Memory (MRAM) using ferromagnetism materials have been receiving attention as memory devices of next generation. The materials constituting the next generation memory devices have some characteristics in common. For example, resistances of such materials vary depending on magnitude and/or direction of applied voltage and/or current. The resistances of such materials can be maintained (meaning non-volatility) even when the applied voltage and/or current is cut off, and thus a refresh operation may not be used for the memory formed based on such materials.

Each memory cell of the resistive memory devices may be formed with one resistive element and one switching element so that data may be stored by controlling voltage and/or current of a bit line and a word line to change resistance of the resistive element.

Due to the advantages of the resistive memory devices, the resistive memory devices have been widely considered in various apparatuses.

SUMMARY

Some example embodiments are directed to provide nonvolatile memory modules that are able to operate in various modes.

Some example embodiments are directed to provide electronic devices including the nonvolatile memory module.

According to an example embodiment, a nonvolatile memory module includes a plurality of memory chips, a spare chip, and a module controller. The plurality of memory chips may be disposed on a printed circuit board (PCB), and each of the plurality of memory chips includes a plurality of nonvolatile memory cells. The spare chip may be disposed on the PCB and include a plurality of nonvolatile memory cells. The spare chip may perform different functions according to operation modes of the plurality of memory chips. The module controller may be disposed on the PCB, and control operations of the plurality of memory chips and the spare chip.

According to an example embodiment, an electronic device includes a nonvolatile memory module, a central processing unit (CPU), and a memory controller configured to control operations of the nonvolatile memory module under a control of the CPU. The nonvolatile memory module may include a plurality of memory chips, a spare chip, and a module controller. The plurality of memory chips may be disposed on a printed circuit board (PCB), and each of the plurality of memory chips may include a plurality of nonvolatile memory cells. The spare chip may be disposed on the PCB and include a plurality of nonvolatile memory cells. The spare chip may perform different functions according to operation modes of the plurality of memory chips. The module controller may be disposed on the PCB, and control operations of the plurality of memory chips and the spare chip.

According to an example embodiments, a nonvolatile memory device includes a first plurality of memory chips each including a plurality of nonvolatile memory cells, a spare chip including a second plurality of nonvolatile memory cells, the spare chip configured to perform different functions according operation modes of the plurality of memory chips, and a controller configured to control the operation modes of the plurality of memory chips and the spare chip.

BRIEF DESCRIPTION OF THE DRAWINGS

Illustrative, non-limiting example embodiments will be more clearly understood from the following detailed description in conjunction with the accompanying drawings.

DETAILED DESCRIPTION

It will be understood that when an element is referred to as being "on," "connected," or "coupled" to another element, it can be directly on, directly connected or coupled to the other element or intervening elements may be present. In contrast, when a element is referred to as being "directly on," "directly connected," or "directly coupled" to another element, there are no intervening elements present. Other words used to describe the relationship between elements should be interpreted in a like fashion (e.g., "between" versus "directly between," "adjacent" versus "directly adjacent," etc.

As used herein, the term "and/or" includes any and all combinations of one or more of the associated listed items. Expressions such as "at least one of," when preceding a list of elements, modify the entire list of elements and do not modify the individual elements of the list. Thus, for example, both "at least one of A, B, or C" and "A, B, and/or C" means either A, B, C or any combination thereof.

In some example embodiments, a nonvolatile memory may be embodied to include a three dimensional (3D) memory array. The 3D memory array may be monolithically formed on a substrate (e.g., semiconductor substrate such as silicon, or semiconductor-on-insulator substrate). The 3D memory array may include two or more physical levels of arrays of memory cells having an active area disposed above the substrate and circuitry associated with the operation of those memory cells, whether such associated circuitry is above or within such substrate. The layers of each level of the array may be directly deposited on the layers of each underlying level of the array. The term "monolithic" means that layers of each level of the array are directly deposited on the layers of each underlying level of the array.

In some example embodiments, the 3D memory array may include vertical NAND strings that are vertically oriented such that at least one memory cell is located over another memory cell. The at least one memory cell may comprise a charge trap layer.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235;

Unless otherwise defined, all terms including technical and scientific terms) used herein have the same meaning as commonly understood by one of ordinary skill in the art to which this inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
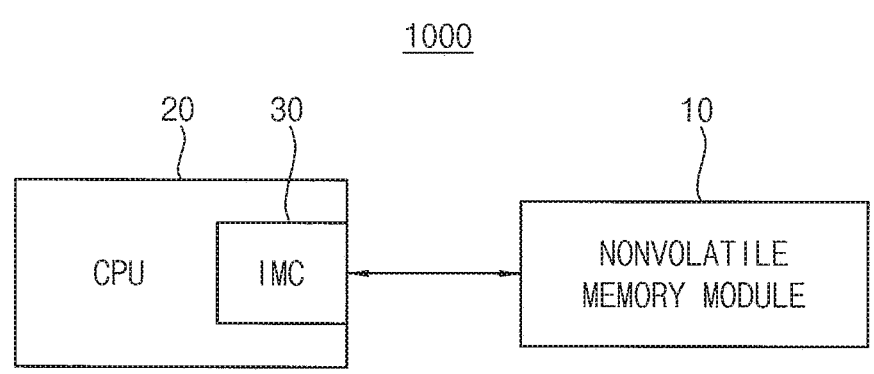
FIG. 1 is a block diagram illustrating an electronic device according to an example embodiment.

FIG. 1 is a block diagram illustrating an electronic device according to an example embodiment.

Referring to FIG. 1, an electronic device 1000 includes a nonvolatile memory module 10 and a central processing unit (CPU) 20.

Although the electronic device 1000 is illustrated to include one nonvolatile memory module 10 in FIG. 1 for ease of explanation, the electronic device 1000 may include more than two nonvolatile memory modules 10.

The nonvolatile memory module 10 may include a plurality of nonvolatile memory chips. Therefore, the nonvolatile memory module 10 may maintain stored data although power is off.

The CPU 20 may include a memory controller IMC 30 controlling operations of the nonvolatile memory module 10.

As illustrated in FIG. 1, the memory controller 30 may be included in the CPU 20. The memory controller 30 included in the CPU 20 may be referred to as an integrated memory controller (IMC).

However, according to example embodiments, the memory controller 30 and the CPU 20 may be separately formed.

As described above, since the nonvolatile memory module 10 includes the plurality of nonvolatile memory chips, the nonvolatile memory module 10 may be used as both a working memory area, which temporarily stores data desired for an operation of the CPU 20, and a data storage area, which preserves programs and/or data.

Operations of the nonvolatile memory module 10, the CPU 20, and the memory controller 30 according to whether the nonvolatile memory module 10 operates in a memory mode, in which the plurality of memory chips are used as a working memory area, or in a storage mode, in which the plurality of memory chips are used as a data storage area, will be described later.

Figure 2:
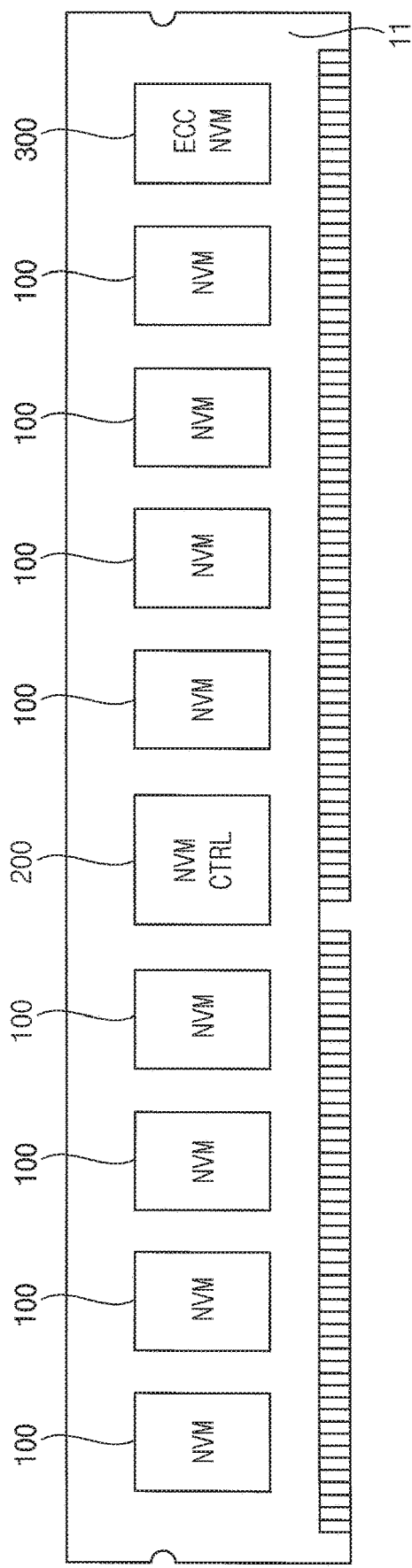
FIG. 2 is a diagram illustrating an example of a nonvolatile memory module included in the electronic device of FIG. 1.

FIG. 2 is a diagram illustrating an example of a nonvolatile memory module included in the electronic device of FIG. 1.

Referring to FIG. 2, the nonvolatile memory module 10 may include a plurality of nonvolatile memory chips NVM 100, a spare chip ECC NVM 300, and a module controller NVM CTRL 200.

As illustrated in FIG. 2, the plurality of nonvolatile memory chips 100 may be disposed on a printed circuit board (PCB) 11, the module controller 200 may be disposed in the middle of the plurality of nonvolatile memory chips 100 on the PCB 11, and the spare chip 30 may be disposed at a side portion of the PCB 11.

In some example embodiments, the plurality of nonvolatile memory chips 100, the spare chip 300, and the module controller 200 may be disposed on the PCB 11 according to a nonvolatile dual in-line memory module (NVDIMM) standard.

Each of the plurality of nonvolatile memory chips 100 may include a plurality of nonvolatile memory cells.

In some example embodiments, each of the plurality of nonvolatile memory chips 100 may have a three dimensional (3D) structure in which the plurality of nonvolatile memory cells are vertically oriented such that at least one memory cell is located over another memory cell.

The module controller 200 may receive a command signal, an address signal, and/or data from the memory controller 30, and control operations of the plurality of nonvolatile memory chips 100 by providing the command signal, the address signal, and the data to at least one of the plurality of nonvolatile memory chips 100.

In some example embodiments, data transmission lines between the module controller 200 and the plurality of nonvolatile memory chips 100 may be coupled in a point-to-point topology. Command transmission lines and address transmission lines between the module controller 200 and the plurality of nonvolatile memory chips 100 may be coupled in a multi-drop topology, a daisy-chain topology, a fly-by daisy-chain topology, or the like. According to example embodiments, the command transmission lines and the address transmission lines between the module controller 200 and the plurality of nonvolatile memory chips 100 may be coupled in a point-to-point topology.

As described above, because the module controller 200 buffers the command signal, the address signal, and the data, which are received from the memory controller 30, and provides the command signal, the address signal, and the data to the plurality of nonvolatile memory chips 100, the memory controller 30 may interface with the nonvolatile memory module 10 by driving only a load of the module controller 200. Accordingly, the electronic device 1000 may include a plurality of nonvolatile memory modules 10 operating under a control of the memory controller 30.

The spare chip 300 may include a plurality of nonvolatile memory cells.

The spare chip 300 may perform different functions according to operation modes of the plurality of nonvolatile memory chips 100.

For example, when the plurality of nonvolatile memory chips 100 operate in the memory mode, in which the plurality of nonvolatile memory chips 100 are used as a working memory area, the spare chip 300 may store an error check and correction (ECC) code for data stored in the plurality of nonvolatile memory chips 100.

When the plurality of nonvolatile memory chips 100 operate in the storage mode, in which the plurality of nonvolatile memory chips 100 are used as a data storage area, the spare chip 300 may be used for storing various kinds of data, which are different from the ECC code.

Figure 3:
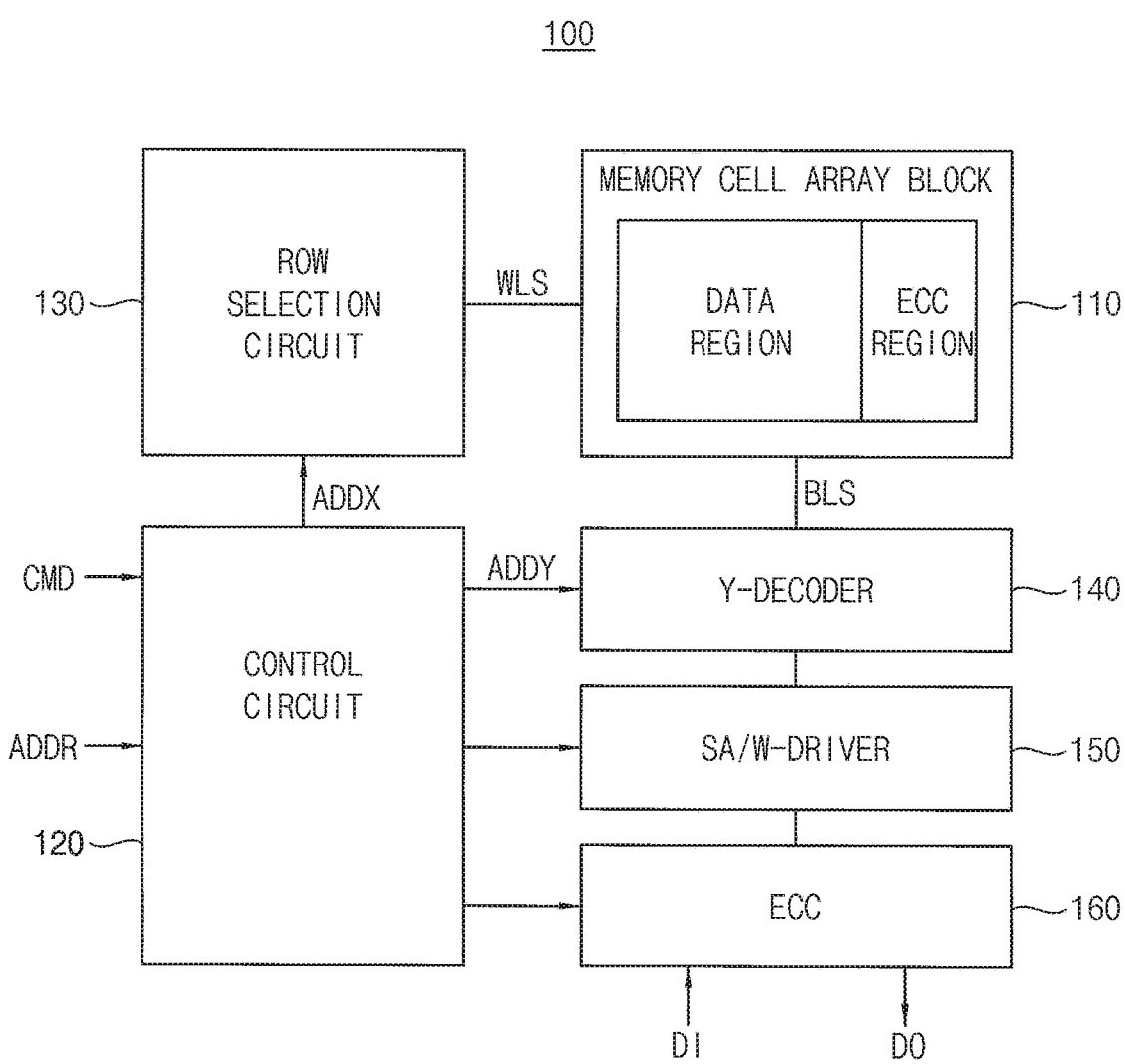
FIG. 3 is a block diagram illustrating an example of a nonvolatile memory chip included in the nonvolatile memory module of FIG. 2.

FIG. 3 is a block diagram illustrating an example of a nonvolatile memory chip included in the nonvolatile memory module of FIG. 2.

Each of the plurality of nonvolatile memory chips 100 included in the nonvolatile memory module 10 of FIG. 2 may be implemented with a nonvolatile memory chip 100 of FIG. 3.

Referring to FIG. 3, the nonvolatile memory chip 100 may include a nonvolatile memory cell array block 110, a control circuit 120, a row selection circuit 130, a column decoder Y-DECODER 140, an input/output circuit 150, and an ECC engine 160. Although some elements desired for describing inventive concepts are illustrated in FIG. 3, the nonvolatile memory chip 100 may further include an address buffer, an input/output buffer, a pre-decoder, and other peripheral circuits.

The nonvolatile memory cell array block 110 may be coupled to the row selection circuit 130 through a plurality of word lines WLS, and be coupled to the column decoder 140 through a plurality of bit lines BLS.

The nonvolatile memory cell array block 110 may include a plurality of resistive memory cells coupled to the plurality of word lines WLS and the plurality of bit lines BLS. Each of the plurality of resistive memory cells may have a resistance varying based on a logic level of a stored data.

In some example embodiments, the nonvolatile memory cell array block 110 may be divided into a data region for storing data and an ECC code region for storing an ECC code. In this case, the plurality of resistive memory cells may be divided into data cells in the data region for storing the data and ECC code cells in the ECC code region for storing the ECC code.

The plurality of resistive memory cells may be selected by the row selection circuit 130 through the plurality of word lines WLS.

In some example embodiments, the nonvolatile memory cell array block 110 may have a three dimensional (3D) structure in which the plurality of resistive memory cells are vertically oriented such that at least one resistive memory cell is located over another resistive memory cell.

Figure 4:
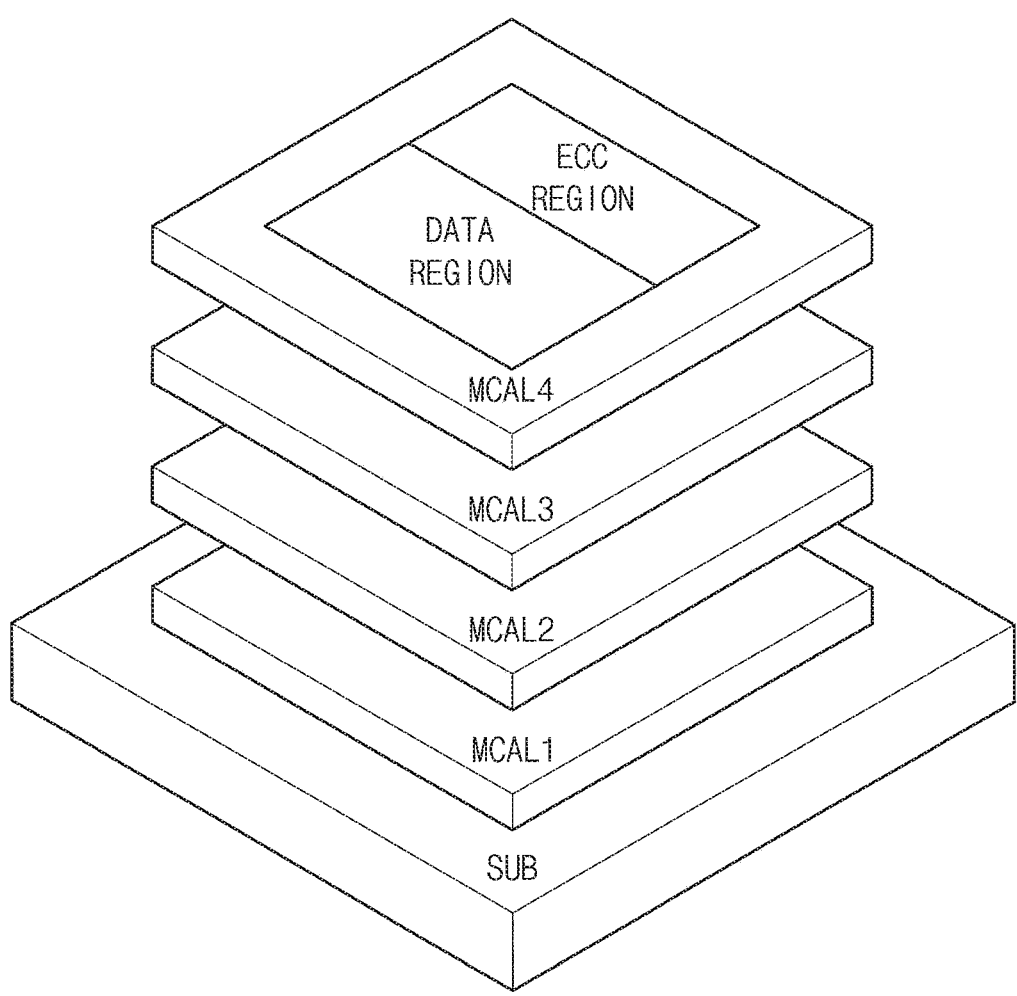
FIG. 4 is a diagram illustrating a three dimensional structure of the nonvolatile memory chip of FIG. 3.

FIG. 4 is a diagram illustrating a three dimensional structure of the nonvolatile memory chip of FIG. 3.

As illustrated in FIG. 4, the nonvolatile memory chip 100 may include a plurality of nonvolatile memory cell array layers MCAL1, MCAL2, MCAL3, and MCAL4 stacked on a substrate SUB in a three dimensional structure.

Each of the plurality of nonvolatile memory cell array layers MCAL1, MCAL2, MCAL3, and MCAL4 may include a nonvolatile memory cell array having the plurality of resistive memory cells. Further, the plurality of resistive memory cells included in each of the plurality of nonvolatile memory cell array layers MCAL1, MCAL2, MCAL3, and MCAL4 may be divided into the data cells in the data region for storing the data and the ECC code cells in the ECC code region for storing the ECC code.

Figure 5:
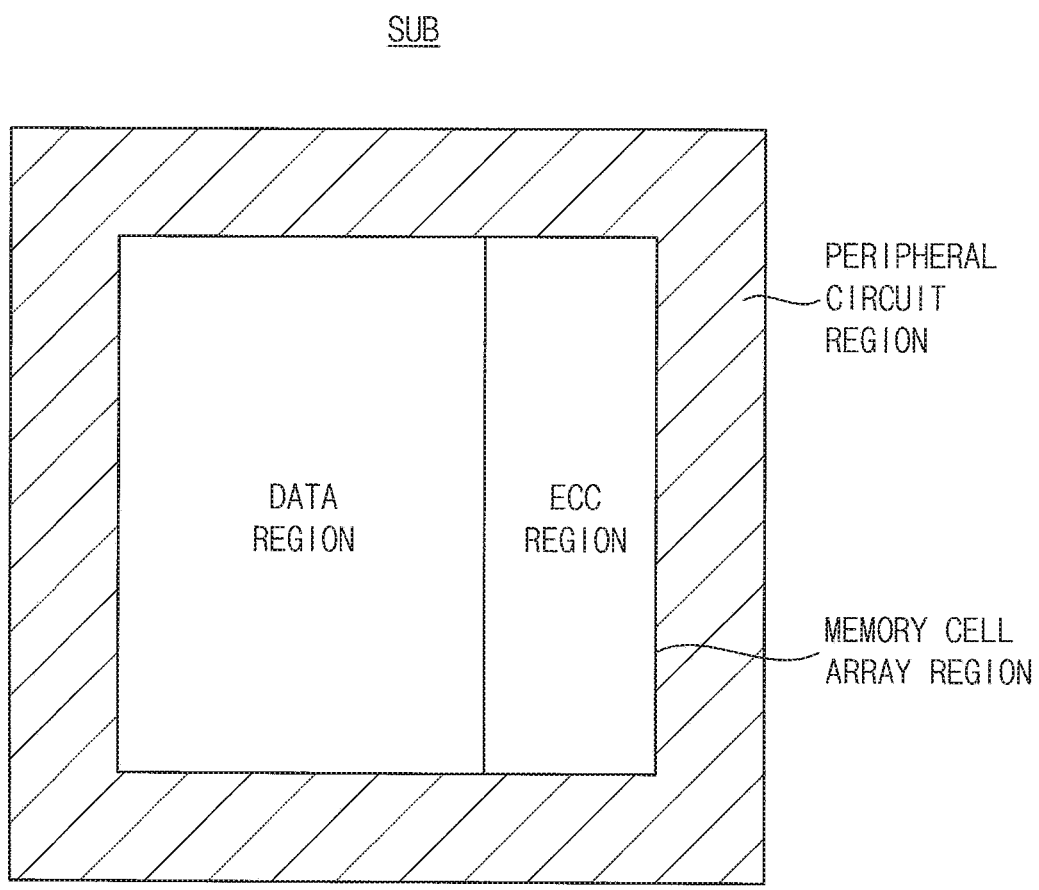
FIG. 5 is a diagram illustrating an example of a substrate included in the nonvolatile memory chip of FIG. 4.

FIG. 5 is a diagram illustrating an example of a substrate included in the nonvolatile memory chip of FIG. 4.

As illustrated in FIG. 5, a middle area of the substrate SUB, which faces the plurality of nonvolatile memory cell array layers MCAL1, MCAL2, MCAL3, and MCAL4, may correspond to a memory cell array region in which the nonvolatile memory cell array having the plurality of resistive memory cells is formed, and a peripheral area of the substrate SUB, which surrounds the middle area, may correspond to a peripheral circuit region in which peripheral circuits, such as the control circuit 120, the row selection circuit 130, the column decoder 140, the input/output circuit 150, and the ECC engine 160, are formed.

The nonvolatile memory cell array block 110 may include the nonvolatile memory cell arrays formed on the plurality of nonvolatile memory cell array layers MCAL1, MCAL2, MCAL3, and MCAL4, which are provided on the middle area of the substrate SUB.

Figure 6:
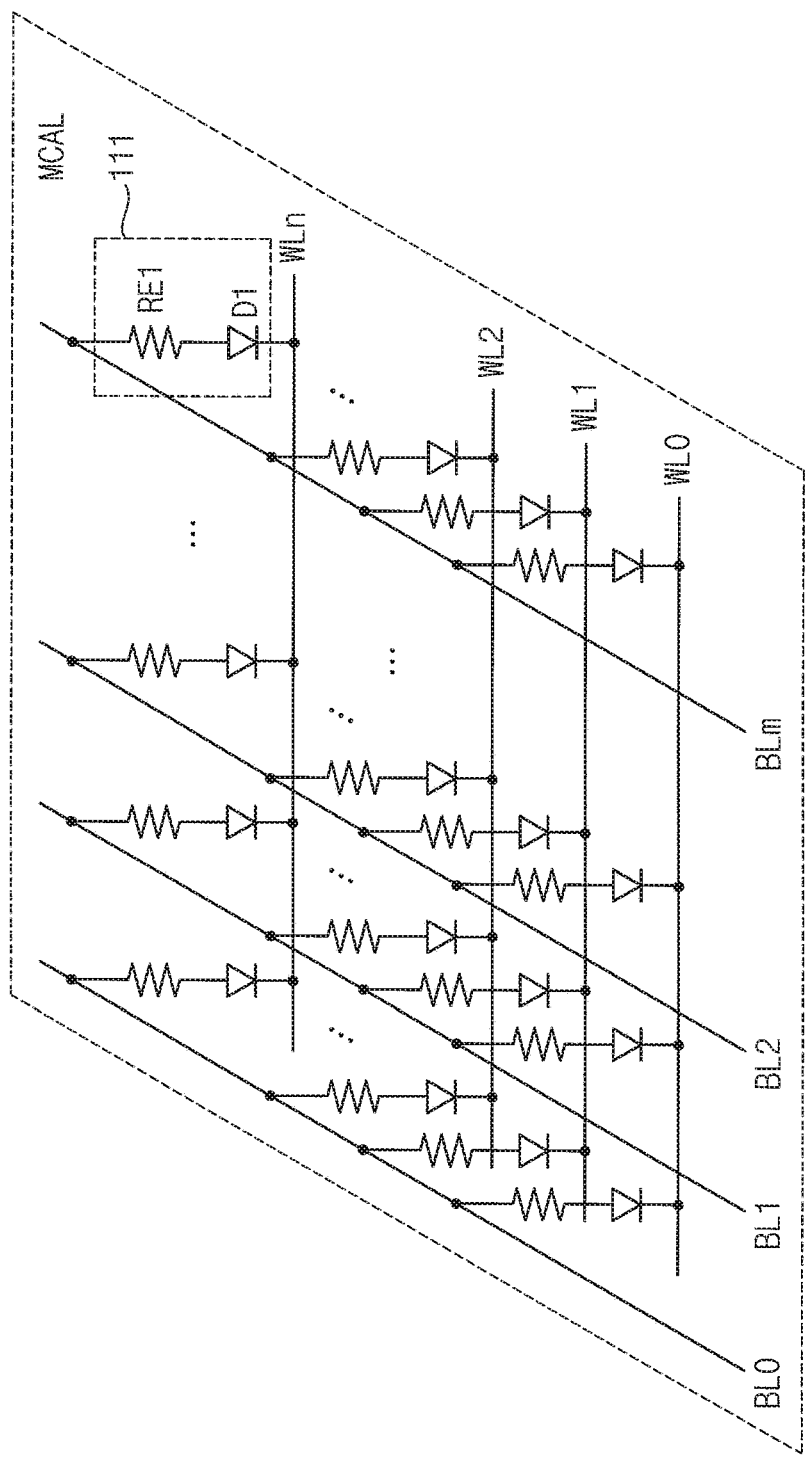
FIG. 6 is a circuit diagram illustrating an example of a nonvolatile memory cell array layer included in the nonvolatile memory chip of FIG. 4.

FIG. 6 is a circuit diagram illustrating an example of a nonvolatile memory cell array layer included in the nonvolatile memory chip of FIG. 4.

Each of the plurality of nonvolatile memory cell array layers MCAL1, MCAL2, MCAL3, and MCAL4 included in the nonvolatile memory chip 100 of FIG. 4 may be implemented with a nonvolatile memory cell array layer MCAL of FIG. 6.

Referring to FIG. 6, a plurality of bit lines BL0~BLm and a plurality of word lines WL0~WLn may be formed on the nonvolatile memory cell array layer MCAL.

The nonvolatile memory cell array layer MCAL may have a cross-point structure, and one resistive memory cell may be formed at each intersections of the plurality of bit lines BL0~BLm and the plurality of word lines WL0~WLn.

As illustrated in FIG. 6, the resistive memory cell 111 may include a resistive element RE1 and a diode D1 coupled in series between a corresponding word line WL and a corresponding bit line BL.

A resistance distribution of the resistive element RE1 may be controlled by a voltage between the corresponding word line WL and the corresponding bit line BL. In some example embodiments, a write operation may be performed on the resistive memory cell 111 by applying voltages between the corresponding word line WL and the corresponding bit line BL, thereby controlling a voltage difference between both ends of the resistive element RE1 or controlling a current flowing through the resistive element RE1.

Figure 7:
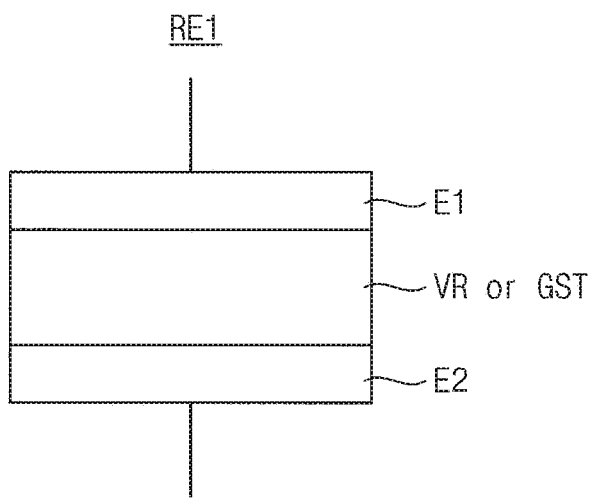
FIG. 7 is a diagram illustrating an example of a resistive element included in a resistive memory cell of FIG. 6.

FIG. 7 is a diagram illustrating an example of a resistive element included in a resistive memory cell of FIG. 6.

Referring to FIG. 7, the resistive element RE1 may include a first electrode E1, a second electrode E2, and resistive material between the first electrode E1 and the second electrode E2. The first electrode E1 and the second electrode E2 may be formed with metal (e.g., tantalum (Ta) or platinum (Pt)). The resistive material may include transition-metal oxide (VR) such as cobalt oxide, or phase change material such as GeSbTe (GST). The phase change material may be in amorphous state or in crystalline state depending on heating time and/or heating temperature, and thus the phase change material may change its resistance according to phase change.

Although phase change random access memory (PRAM) using phase change materials, resistance random access memory (RRAM) using materials having variable resistance, and magnetic random access memory (MRAM) using ferromagnetism materials may be differentiated from each other, those may be totally referred to as resistive memories. The nonvolatile memory chip 100 according to example embodiments may be implemented with various resistive memories including PRAM, RRAM and MRAM.

Figure 8:
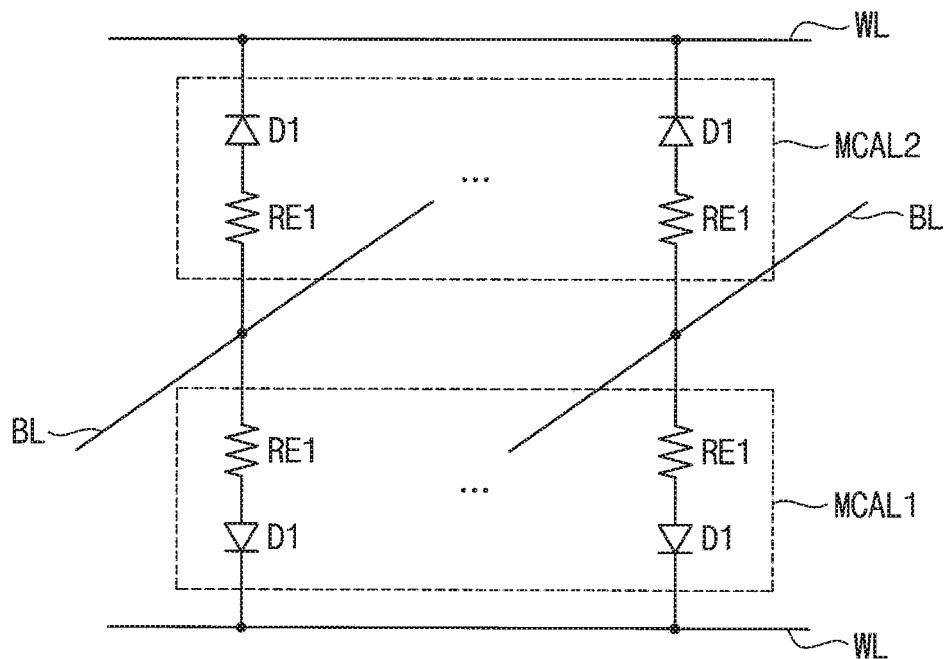
FIG. 8 is a circuit diagram illustrating another example of a nonvolatile memory cell array layer included in the nonvolatile memory chip of FIG. 4.

FIG. 8 is a circuit diagram illustrating another example of a nonvolatile memory cell array layer included in the nonvolatile memory chip of FIG. 4.

In FIG. 8, two nonvolatile memory cell array layers MCAL1 and MCAL2, which are stacked consecutively, are illustrated.

As illustrated in FIG. 8, each of the nonvolatile memory cell array layers MCAL1 and MCAL2 may have a cross-point structure, and one resistive memory cell may be formed at an intersection of a bit line BL and a word line WL.

A resistive memory cell formed on each of the nonvolatile memory cell array layers MCAL1 and MCAL2 of FIG. 8 is the same as the resistive memory cell formed on the nonvolatile memory cell array layer MCAL of FIG. 6.

However, as illustrated in FIG. 8, the nonvolatile memory cell array layers MCAL1 and MCAL2, which are stacked consecutively, may share one bit line BL.

Therefore, when the nonvolatile memory cell array block 110 is implemented with the nonvolatile memory cell array layers MCAL1 and MCAL2 of FIG. 8, a size of the nonvolatile memory cell array block 110 may be decreased.

Referring again to FIG. 3, the control circuit 120 may receive the command signal CMD and the address signal ADDR from the module controller 200 included in the nonvolatile memory module 10, and control a write operation, a read operation, and an erase operation of the nonvolatile memory chip 100 based on the command signal CMD and the address signal ADDR.

For example, the control circuit 120 may generate timing control signals such as a write enable signal, a read enable signal, a sense enable signal, etc., based on the command signal CMD. Further, the control circuit 120 may generate a row address ADDX and a column address ADDY based on the address signal ADDR.

The control circuit 120 may provide the timing control signals to the row selection circuit 130, the column decoder 140, and the input/output circuit 150 to control the write operation, the read operation, and the erase operation of the nonvolatile memory chip 100. In addition, the control circuit 120 may provide the row address ADDX to the row selection circuit 130 and provide the column address ADDY to the column decoder 140.

The row selection circuit 130 may be coupled to the nonvolatile memory cell array block 110 through the plurality of word lines WLS. The row selection circuit 130 may select one of the plurality of word lines WLS based on the row address ADDX to perform the write operation or the read operation.

The column decoder 140 may be coupled to the nonvolatile memory cell array block 110 through the plurality of bit lines BLS. The column decoder 140 may select one of the plurality of bit lines BLS based on the column address ADDY and connect the selected bit line to the input/output circuit 150.

The input/output circuit 150 may include a sense amplifier SA and a write driver W-DRIVER.

During the write operation, the ECC engine 160 may receive write data. DI from the module controller 200, and generate an ECC code based on the write data DI.

The write driver may receive the write data DI and the ECC code corresponding to the write data DI from the ECC engine 160, and write the write data DI and the ECC code in the data cells and the ECC code cells, respectively, included in the plurality of nonvolatile memory cell array layers MCAL1, MCAL2, MCAL3, and MCAL4.

During the read operation, the sense amplifier SA may sense voltage or current of a bit line BL formed by the nonvolatile memory cell array block 110 to generate read data DO and the ECC code, and provide the read data DO and the ECC code to the ECC engine 160.

The ECC engine 160 may detect and correct an error of the read data DO based on the read data DO and the ECC code received from the sense amplifier SA. The control circuit 120 may control operations of the ECC engine 160 such as code generation, error detection and error correction.

The read data DO outputted by the FCC engine 160 may be provided to the module controller 200.

In some example embodiments, the ECC code may be a parity check code, a Hamming code, etc. For example, the parity check code may be determined such that ECC calculation may result in a constant value, in which the ECC calculation may be an exclusive-OR operation on each bit of the read data DO and each bit of the parity check code. The result of the ECC calculation may be "1" in case of an odd parity type, or "0" in case of an even parity type. The ECC engine 160 may determine that the read data DO includes an error if the result of the ECC calculation is different from a predetermined value, and correct the error to output the corrected data. As a number of bits included in the ECC code increases, a number of error bits that the ECC engine 160 is able to correct may increase while increasing cell overhead. Therefore, the number of bits included in the FCC code may be determined based on a desired error correction performance.

As described above with reference to FIGS. 1 to 8, because the nonvolatile memory module 10 includes the plurality of nonvolatile memory chips 100 having the plurality of resistive memory cells, the nonvolatile memory module 10 may be used as both a working memory area, which temporarily stores data desired for an operation of the CPU 20, and a data storage area, which preserves programs and/or data.

In some example embodiments, the spare chip 300 may have a same structure as the plurality of nonvolatile memory chips 100. For example, the spare chip 300 may be implemented with the nonvolatile memory chip 100 of FIG. 3. Therefore, the spare chip 300 may be used for a different purpose from a purpose of the plurality of nonvolatile memory chips 100 while the spare chip 300 has the same structure as the plurality of nonvolatile memory chips 100.

In some example embodiments, the operation mode of the plurality of nonvolatile memory chips 100 included in the nonvolatile memory module 10 may be determined at an initial stage of power-up of the electronic device 1000.

Figure 9:
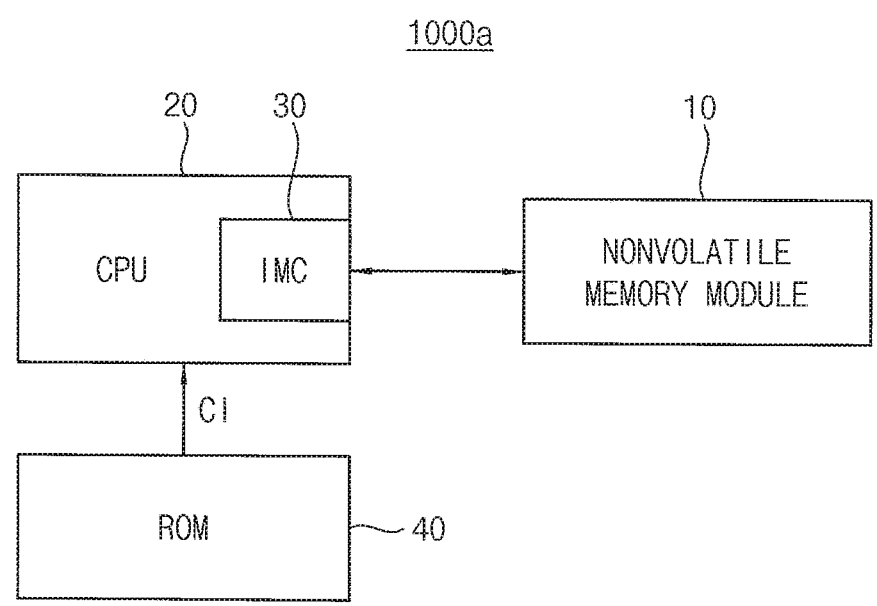
FIG. 9 is a block diagram illustrating an example of the electronic device of FIG. 1.

FIG. 9 is a block diagram illustrating an example of the electronic device of FIG. 1.

Comparing with the electronic device 1000 of FIG. 1, an electronic device 1000a of FIG. 9 further includes a read only memory ROM 40.

The ROM 40 may store configuration information CI, which represents whether the plurality of nonvolatile memory chips 100 operate in the memory mode or in the storage mode.

The CPU 20 may read the configuration information CI from the ROM 40 at an initial stage of power-up, and provide the configuration information CI to the module controller 200 included in the nonvolatile memory module 10 through the memory controller 30.

In this case, the module controller 200 may operate the plurality of nonvolatile memory chips 100 in one of the memory mode and the storage mode based on the configuration information CI.

In other example embodiments, the operation mode of the plurality of nonvolatile memory chips 100 included in the nonvolatile memory module 10 may be determined by a command from the CPU 20 during a normal operation of the electronic device 1000.

For example, the CPU 20 may receive configuration information, which represents whether the plurality of nonvolatile memory chips 100 operate in the memory mode or in the storage mode, from the ROM 40 during the normal operation of the electronic device 1000, and provide the configuration information to the module controller 200 included in the nonvolatile memory module 10 through the memory controller 30.

In this case, the module controller 200 may operate the plurality of nonvolatile memory chips 100 in one of the memory mode and the storage mode based on the configuration information.

In some example embodiments, the module controller 200 may determine the operation mode of the plurality of nonvolatile memory chips 100 as one of the memory mode and the storage mode based on an endurance level of the plurality of nonvolatile memory chips 100.

In other example embodiments, the module controller 200 may determine the operation mode of the plurality of nonvolatile memory chips 100 as one of the memory mode and the storage mode based on a number of at least one of write operations and erase operations performed on each of the plurality of nonvolatile memory chips 100.

For example, the module controller 200 may count a number of at least one of write operations or erase operations performed on each of the plurality of nonvolatile memory chips 100 to generate a use value for each of the plurality of memory chips 100. When a number of memory chips having the use value greater than a reference value is smaller than a threshold value, the module controller 200 may operate the plurality of nonvolatile memory chips 100 in the memory mode. On the other hand, when a number of memory chips having the use value greater than the reference value is equal to or greater than the threshold value, the module controller 200 may operate the plurality of nonvolatile memory chips 100 in the storage mode.

The module controller 200 may notify the determined operation mode of the plurality of nonvolatile memory chips 100 to the CPU 20 through the memory controller 30. Therefore, the CPU 20 may use the nonvolatile memory module 10 according to the determined operation mode of the plurality of nonvolatile memory chips 100.

Figure 10:
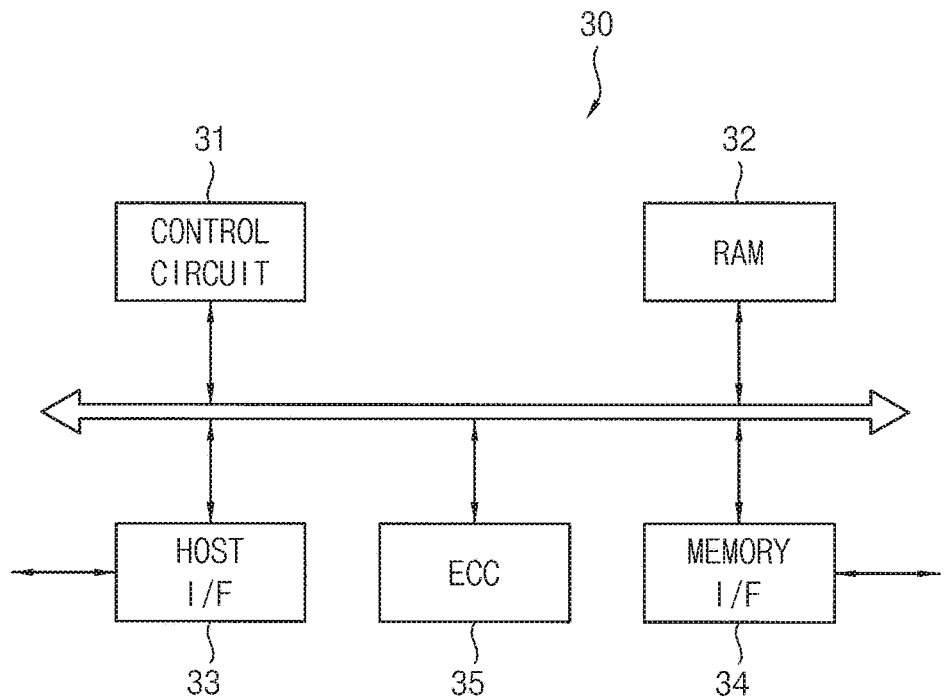
FIG. 10 is a diagram illustrating an example of a memory controller included in the electronic device of FIG. 1.

FIG. 10 is a diagram illustrating an example of a memory controller included in the electronic device of FIG. 1.

The memory controller 30 may control data transfer between the CPU 20 and the nonvolatile memory module 10.

Referring to FIG. 10, the memory controller 30 may include a control circuit 31, a buffer memory RAM 32, a host interface 33, a memory interface 34, and an ECC engine 35.

The control circuit 31 may perform operations for the data transfer.

The buffer memory 32 may be implemented with a dynamic random access memory (DRAM), a static random access memory (SRAM), a phase change random access memory (PRAM), a ferroelectric random access memory (FRAM), a resistance random access memory (RRAM), a magnetic random access memory (MRAM), etc.

The buffer memory 32 may be an operational memory of the control circuit 31. In some example embodiments, the buffer memory 32 may be included in the memory controller 30. In other example embodiments, the buffer memory 32 may be not be included in the memory controller 30.

The host interface 33 may be coupled to the CPU 20, and the memory interface 34 may be coupled to the nonvolatile memory module 10. The control circuit 31 may communicate with the CPU 20 via the host interface 33.

Further, the control circuit 31 may communicate with the nonvolatile memory module 10 via the memory interface 34.

When the plurality of nonvolatile memory chips 100 included in the nonvolatile memory module 10 operate in the memory mode, the ECC engine 35 may be activated.

In a write operation, when the host interface 33 receives write data, which is to be written in the plurality of nonvolatile memory chips 100 included in the nonvolatile memory module 10, from the CPU 20, the ECC engine 35 may generate an ECC code for the write data, and the memory interface 34 may provide the write data and the ECC code to the module controller 200. The module controller 200 may store the write data in at least one of the plurality of nonvolatile memory chips 100, and store the ECC code in the spare chip 300.

In a read operation, the module controller 200 may read read data from the plurality of nonvolatile memory chips 100, read the ECC code corresponding to the read data from the spare chip 300, and output the read data and the ECC code. When the memory interface 34 receives the read data and the ECC code from the module controller 200, the ECC engine 35 may correct an error or errors in the read data based on the ECC code, and the host interface 33 may provide the corrected read data to the CPU 20.

A size of write data stored in the plurality of nonvolatile memory chips 100 by the memory controller 30 in the storage mode may be greater than a size of write data stored in the plurality of nonvolatile memory chips 100 by the memory controller 30 in the memory mode. Therefore, a size of the ECC code for the write data stored in the plurality of nonvolatile memory chips 100 by the memory controller 30 in the storage mode may be also greater than a size of the ECC code for the write data stored in the plurality of nonvolatile memory chips 100 by the memory controller 30 in the memory mode. Therefore, a capacity of the spare chip 300 may be insufficient to store the ECC code for the write data in the storage mode.

Therefore, when the plurality of nonvolatile memory chips 100 included in the nonvolatile memory module 10 operate in the storage mode, the ECC engine 35 may be deactivated, and the memory controller 30 may not provide the ECC code for the write data to the module controller 200. In this case, as will be described below, the module controller 200 may generate the ECC code for the write data.

Figure 11:
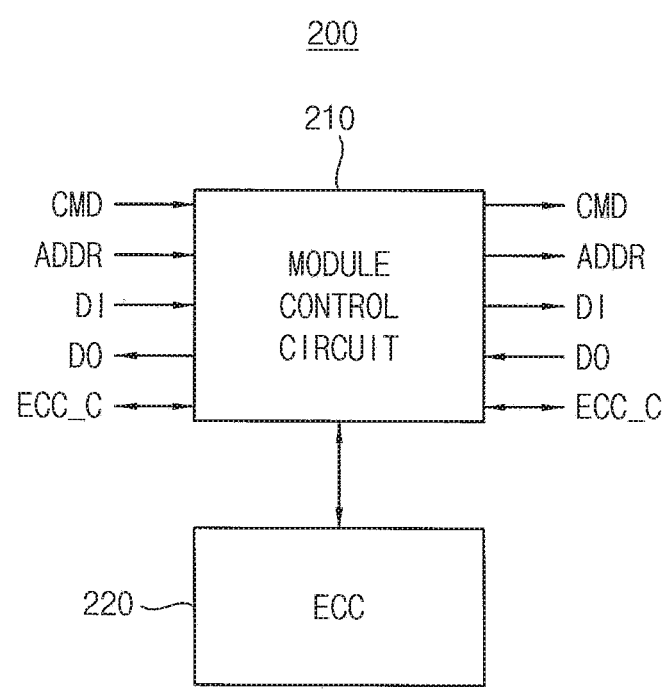
FIG. 11 is a block diagram illustrating an example of a module controller included in the nonvolatile memory module of FIG. 2.

FIG. 11 is a block diagram illustrating an example of a module controller included in the nonvolatile memory module of FIG. 2.

Referring to FIG. 11, the module controller 200 may include a module control circuit 210 and an ECC engine 220.

When the plurality of nonvolatile memory chips 100 operate in the memory mode, the module control circuit 210 may receive the command signal CMD, the address signal ADDR, the write data DI, and the ECC code ECC_C from the memory controller 30 in the write operation, store the write data DI in at least one of the plurality of nonvolatile memory chips 100 based on the command signal CMD and the address signal ADDR, and store the ECC code ECC_C in the spare chip 300. Further, the module control circuit 210 may receive the command signal CMD and the address signal ADDR from the memory controller 30 in the read operation, and provide read data DO, which is read from the plurality of nonvolatile memory chips 100, and the ECC code ECC_C, which is read from the spare chip 300, to the memory controller 30.

When the plurality of nonvolatile memory chips 100 operate in the storage mode, the module control circuit 210 may not receive the ECC code ECC_C from the memory controller 30 in the write operation. When the module control circuit 210 receives the write data DI from the memory controller 30 in the write operation, the ECC engine 220 included in the module controller 200 may generate the ECC code for the write data DI. The module control circuit 210 may store the write data DI, which is received from the memory controller 30, in the data cells of the plurality of nonvolatile memory chips 100, and the ECC code, which is received from the ECC engine 220, in the ECC code cells of the plurality of nonvolatile memory chips 100. In the read operation, the module control circuit 210 may read read data DO from the data cells and the ECC code from the ECC code cells of the plurality of nonvolatile memory chips 100, and the ECC engine 220 may correct an error of the read data DO based on the ECC code. The module control circuit 210 may provide the corrected read data DO to the memory controller 30.

In some example embodiments, when the plurality of nonvolatile memory chips 100 included in the nonvolatile memory module 10 operate in the storage mode, the spare chip 300 may be deactivated.

In other example embodiments, when the plurality of nonvolatile memory chips 100 included in the nonvolatile memory module 10 operate in the storage mode, the spare chip 300 may be used for storing various kinds of data, which are different from the ECC code.

For example, when the plurality of nonvolatile memory chips 100 included in the nonvolatile memory module 10 operate in the storage mode, the spare chip 300 may store metadata of the plurality of nonvolatile memory chips 100.

That is, when the plurality of nonvolatile memory chips 100 included in the nonvolatile memory module 10 operate in the storage mode, the module controller 200 may store the metadata of the plurality of nonvolatile memory chips 100 in the spare chip 300. The metadata may include validity information, which represents whether each of the plurality of nonvolatile memory chips 100 is in an activated state or in a deactivated state, a program/erase (P/E) cycle of each of the plurality of nonvolatile memory chips 100, etc.

For example, when the plurality of nonvolatile memory chips 100 included in the nonvolatile memory module 10 operate in the storage mode, the spare chip 300 may store parameters desired for an operation of the CPU 20. In this case, the CPU 20 may provide the parameters to the module controller 200 through the memory controller 30, and the module controller 200 may store the parameters in the spare chip 300.

Figure 12:
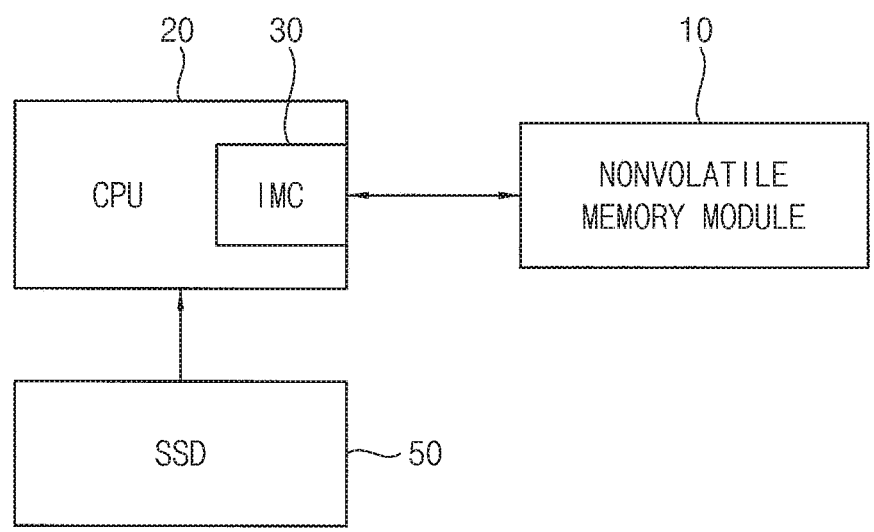
FIG. 12 is a block diagram illustrating another example of the electronic device of FIG. 1.

FIG. 12 is a block diagram illustrating another example of the electronic device of FIG. 1.

Comparing with the electronic device 1000 of FIG. 1, an electronic device 1000b of FIG. 12 further includes a solid state drive (SSD) device 50.

The SSD device 50 may be coupled to the CPU 20.

In some example embodiments, when the plurality of nonvolatile memory chips 100 included in the nonvolatile memory module 10 operate in the storage mode, the spare chip 300 may be used as a cache memory for data stored in the SSD device 50. For example, the CPU 20 may provide cache data for the data stored in the SSD device 50 to the module controller 200 through the memory controller 30, and the module controller 200 may store the cache data in the spare chip 300.

Figure 13:
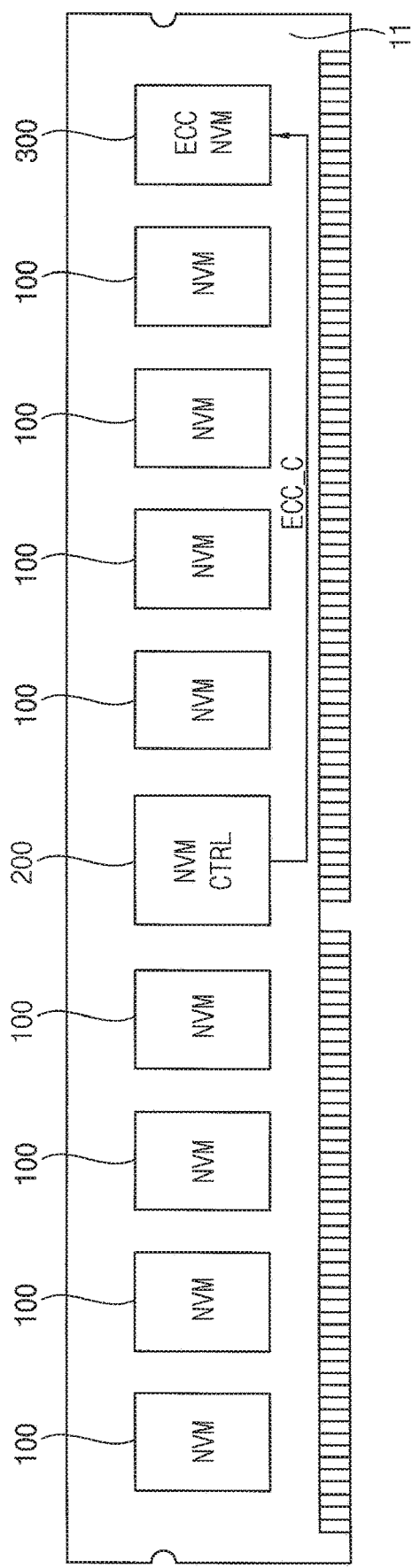
FIGS. 13 to 15 are diagrams for describing examples of usage of a spare chip included in the nonvolatile memory module of FIG. 2.
Figure 14:
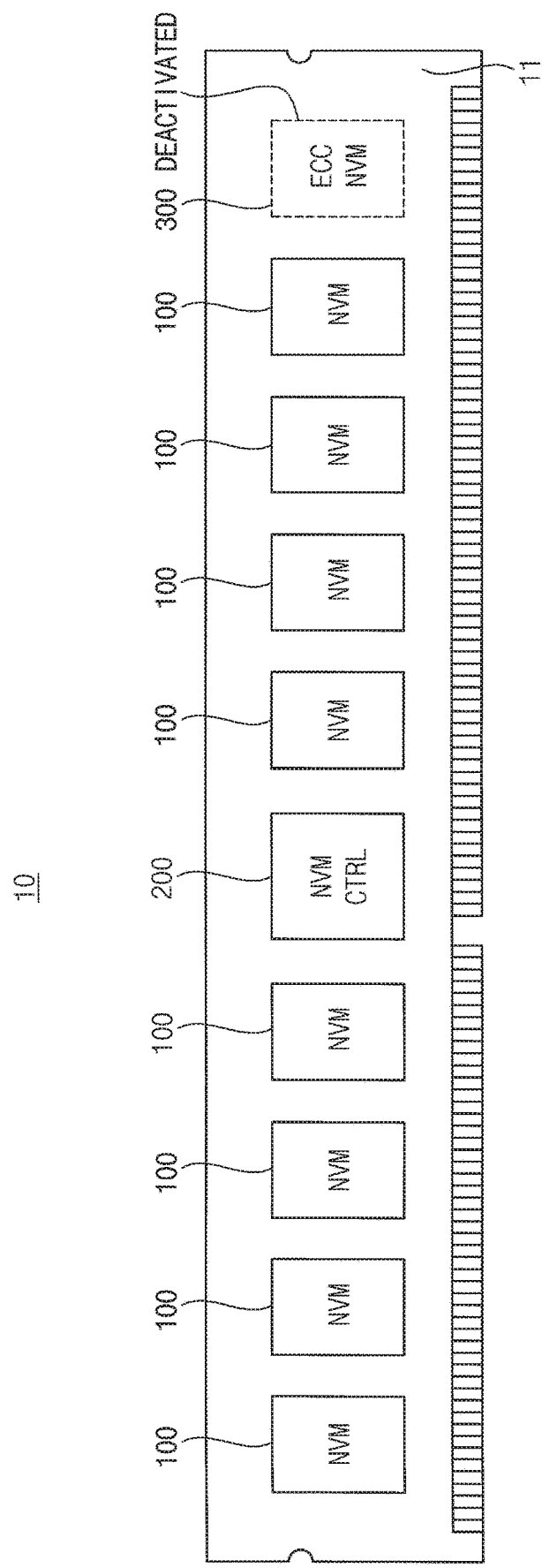
Figure 15:
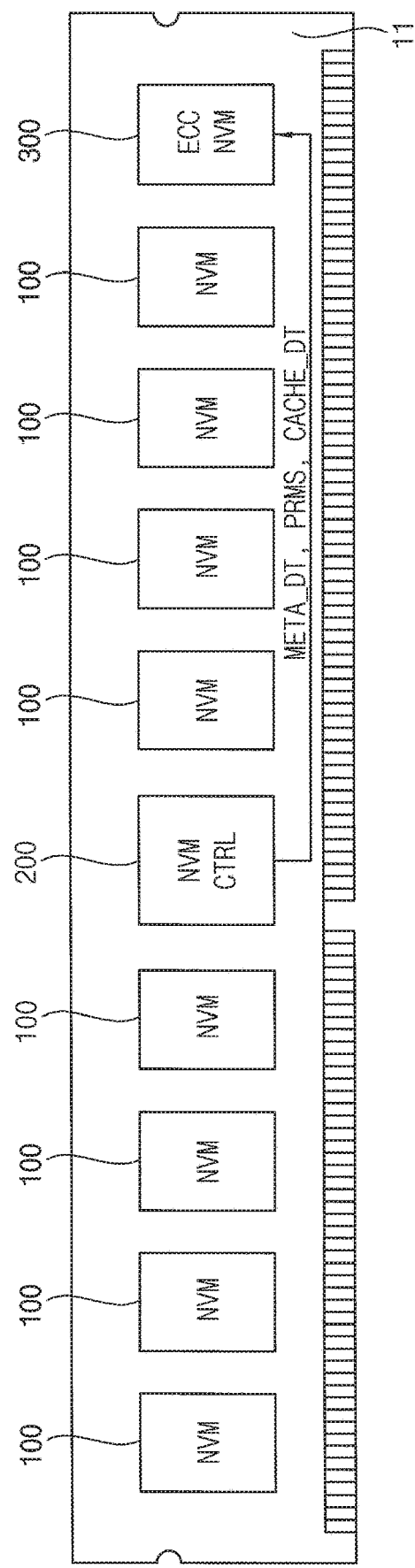

FIGS. 13 to 15 are diagrams for describing examples of usage of a spare chip included in the nonvolatile memory module of FIG. 2.

As illustrated in FIG. 13, when the plurality of nonvolatile memory chips 100 included in the nonvolatile memory module 10 operate in the memory mode, the spare chip 300 may store the ECC code ECC_C for the write data.

As illustrated in FIG. 14, when the plurality of nonvolatile memory chips 100 included in the nonvolatile memory module 10 operate in the storage mode, the spare chip 300 may be deactivated.

As illustrated in FIG. 15, when the plurality of nonvolatile memory chips 100 included in the nonvolatile memory module 10 operate in the storage mode, the spare chip 300 may be used for storing various kinds of data, such as the metadata META_DT of the plurality of nonvolatile memory chips 100, the parameters PRMS desired for an operation of the CPU 20, the cache data CACHE_DT for the data stored in the SSD device 50, etc.

As described above, according to the example embodiments, the nonvolatile memory module 10 including the plurality of nonvolatile memory chips 100 may further include the spare chip 300, and the spare chip 300 may be used in various ways based on whether the plurality of nonvolatile memory chips 100 operate in the memory mode or in the storage mode. Therefore, the electronic device 1000 including the nonvolatile memory module 10 may increase an overall performance by increasing a utilization of the nonvolatile memory module 10 according to the operation modes.

Figure 16:
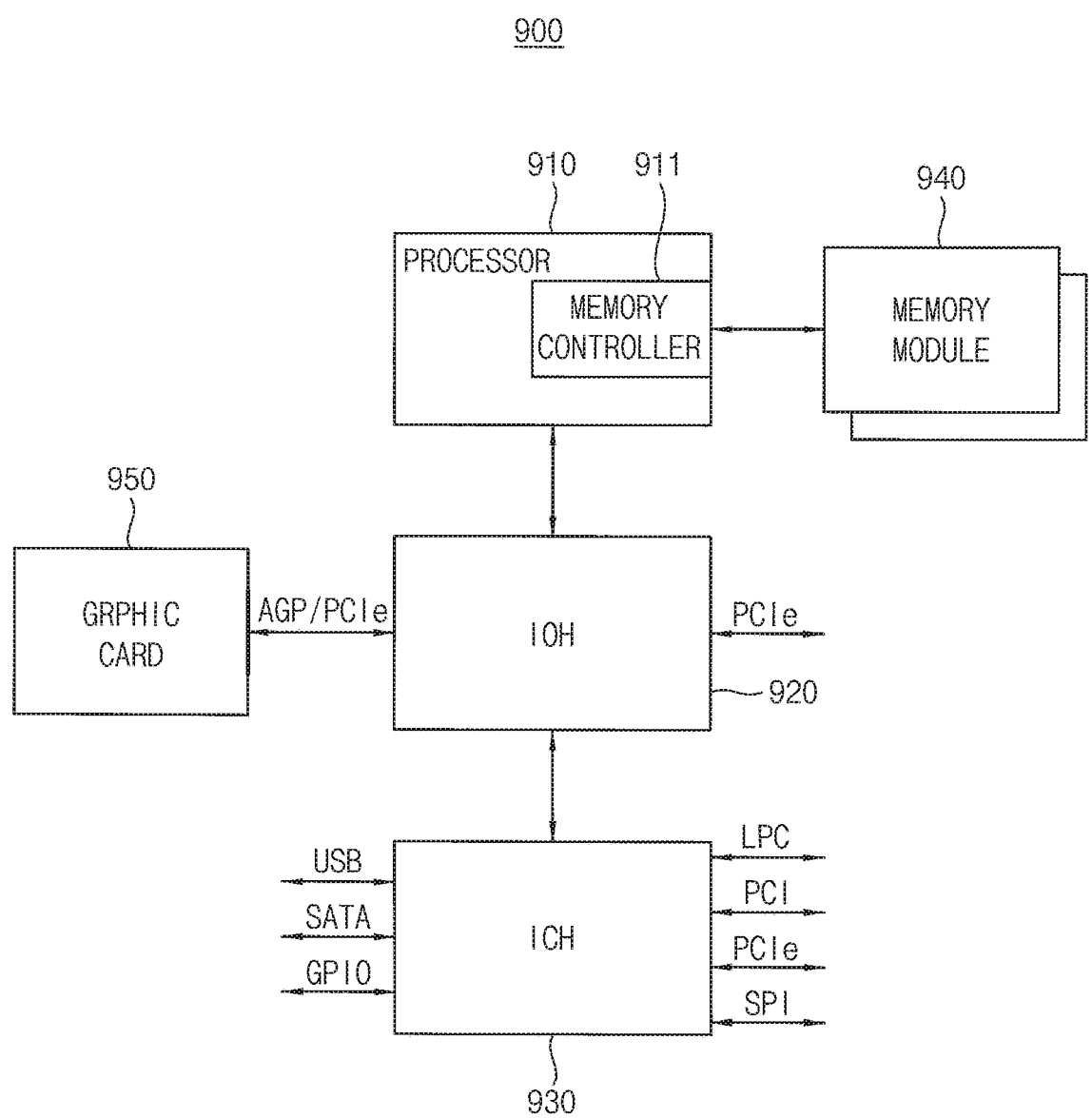
FIG. 16 is a block diagram illustrating a computing system according to an example embodiment.

FIG. 16 is a block diagram illustrating a computing system according to an example embodiment.

Referring to FIG. 16, a computing system 900 includes a processor 910, an input/output hub (IOH) 920, an input/output controller hub (ICH) 930, at least one memory module 940, a graphics card 950, and a voltage regulator 960. In some example embodiments, the computing system 900 may be a personal computer (PC), a server computer, a workstation, a laptop computer, a mobile phone, a smart phone, a personal digital assistant (PDA), a portable multimedia player (PMP), a digital camera), a digital television, a set-top box, a music player, a portable game console, a navigation system, etc.

The processor 910 may perform various computing functions, such as executing specific software for performing specific calculations or tasks. For example, the processor 910 may be a microprocessor, a central process unit (CPU), a digital signal processor, or the like. In some example embodiments, the processor 910 may include a single core or multiple cores. For example, the processor 910 may be a multi-core processor, such as a dual-core processor, a quad-core processor, a hexa-core processor, etc. Although FIG. 16 illustrates the computing system 900 including one processor 910, in some example embodiments, the computing system 900 may include a plurality of processors.

The processor 910 may include a memory controller 911 for controlling operations of the memory module 940. The memory controller 911 included in the processor 910 may be referred to as an integrated memory controller (IMC). A memory interface between the memory controller 911 and the memory module 940 may be implemented with a single channel including a plurality of signal lines, or may bay be implemented with multiple channels, to each of which at least one memory module 940 may be coupled. In some example embodiments, the memory controller 911 may be located inside the input/output hub 920. The input/output hub 920 including the memory controller 911 may be referred to as memory controller hub (MCH).

The processor 910, the memory controller 911, and the memory module 940 may be implemented with the electronic device 1000 of FIG. 1. A structure and an operation of the electronic device 1000 are described above with reference with FIGS. 1 to 15. Therefore, detained description about the processor 910, the memory controller 911, and the memory module 940 will be omitted here.

The input/output hub 920 may manage data transfer between processor 910 and devices, such as the graphics card 950. The input/output hub 920 may be coupled to the processor 910 via various interfaces. For example, the interface between the processor 910 and the input/output hub 920 may be a front side bus (FSB), a system bus, a HyperTransport, a lightning data transport (LDT), a QuickPath interconnect (QPI), a common system interface (CSI), etc. The input/output hub 920 may provide various interfaces with the devices. For example, the input/output hub 920 may provide an accelerated graphics port (AGP) interface, a peripheral component: interface-express (PCIe), a communications streaming architecture (CSA) interface, etc. Although FIG. 16 illustrates the computing system 900 including one input/output hub 920, in some example embodiments, the computing system 900 may include a plurality of input/output hubs.

The graphics card 950 may be coupled to the input/output hub 920 via AGP or PCIe. The graphics card 950 may control a display device for displaying an image. The graphics card 950 may include an internal processor for processing image data and an internal memo device. In some example embodiments, the input/output hub 920 may include an internal graphics device along with or instead of the graphics card 950 outside the graphics card 950. The graphics device included in the input/output hub 920 may be referred to as integrated graphics. Further, the input/output hub 920 including the internal memory controller and the internal graphics device may be referred to as a graphics and memory controller hub (GMCH).

The input/output controller hub 930 may perform data buffering and interface arbitration to efficiently operate various system interfaces. The input/output controller hub 930 may be coupled to the input/output hub 920 via an internal bus, such as a direct media interface (DMI), a hub interface, an enterprise Southbridge interface (ESI), PCIe, etc.

The input/output controller hub 930 may provide various interfaces with peripheral devices. For example, the input/output controller hub 930 may provide a universal serial bus (USB) port, a serial advanced technology attachment (SATA) port, a general purpose input/output (GPIO), a low pin count (LPC) bus, a serial peripheral interface (SPI), PCI, PCIe, etc.

In some example embodiments, the processor 910, the input/output hub 920 and the input/output controller hub 930 may be implemented as separate chipsets or separate integrated circuits. In other embodiments, at least two of the processor 910, the input/output hub 920 and the input/output controller hub 930 may be implemented as a single chipset.

The various controllers and/or processing units described herein may be implemented using hardware components and a combination of software components and hardware component. For example, the hardware components may include microcontrollers, memory modules, sensors, amplifiers, band-pass filters, analog to digital converters, and processing devices, or the like. A processing device may be implemented using one or more hardware device(s) configured to carry out and/or execute program code by performing arithmetical, logical, and input/output operations. The processing device(s) may include a processor, a controller and an arithmetic logic unit, a digital signal processor, a microcomputer, a field programmable array, a programmable logic unit, a microprocessor or any other device capable of responding to and executing instructions in a defined manner. The processing device(s) may run an operating system (OS) and one or more software applications that run on the OS. The processing device also may access, store, manipulate, process, and create data in response to execution of the software. For purpose of simplicity, the description of a processing device is used as singular; however, one skilled in the art will appreciated that a processing device may include multiple processing elements and multiple types of processing elements. For example, a processing device may include multiple processors or a processor and a controller. In addition, different processing configurations are possible, such as parallel processors, multi-core processors, distributed processing, or the like.

The software may include a computer program, a piece of code, an instruction, or some combination thereof, to independently or collectively instruct and/or configure the processing device to operate as desired, thereby transforming the processing device into a special purpose processor. Software and data may be embodied permanently or temporarily in any type of machine, component, physical or virtual equipment, and/or computer storage medium or device. The software also may be distributed over network coupled computer systems so that the software is stored and executed in a distributed fashion. The software and data may be stored by one or more computer readable recording mediums.

The foregoing is illustrative of the present inventive concepts and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concepts as defined in the claims.

What is claimed is:

1. A nonvolatile memory module, comprising:
a plurality of memory chips on a printed circuit board (PCB), each of the plurality of memory chips including a plurality of nonvolatile memory cells;
a spare chip on the PCB and configured to include a plurality of nonvolatile memory cells, the spare chip configured to perform different functions according to operation modes of the plurality of memory chips; and
a module controller on the PCB, the module controller configured to control operations of the plurality of memory chips and the spare chip,
wherein the plurality of memory chips are configured to operate in a memory mode, in which the plurality of memory chips are used as a working memory area that temporarily stores data for an operation of the nonvolatile memory module, and a storage mode, in which the plurality of memory chips are used as a data storage area that preserves data, the storage mode being independent from the memory mode,
when the plurality of memory chips are configured to operate in the memory mode, the spare chip is configured to store an error check and correction (ECC) code for data stored in the plurality of memory chips, and
when the plurality of memory chips are configured to operate in the storage mode, the spare chip is configured to store metadata of the plurality of memory chips, the metadata including validity information as to whether each of the plurality of nonvolatile memory chips is in an activated state or in an deactivated state.

2. The nonvolatile memory module of claim 1, wherein when the plurality of memory chips operate in the storage mode, the module controller is configured to,
during a write operation,
receive write data from outside,
generate an ECC code for the write data, and
store the write data in the plurality of memory chips and the ECC code in the spare chip, and
during a read operation,
read read data and the ECC code from the plurality of memory chips and the spare chip, respectively,
correct an error in the read data based on the ECC code, and
output the corrected read data.

3. The nonvolatile memory module of claim 1, wherein the module controller is configured to determine an operation mode of the plurality of memory chips from among the memory mode and the storage mode based on configuration information received from outside.

4. The nonvolatile memory module of claim 1, wherein the module controller is configured to determine an operation mode of the plurality of memory chips from among the memory mode and the storage mode based on an endurance level of the plurality of memory chips.

5. The nonvolatile memory module of claim 4, wherein the module controller is configured to,
count a number of at least one of write operations or erase operations performed on each of the plurality of memory chips to generate a use value for each of the plurality of memory chips,
operate the plurality of memory chips in the memory mode when a number of memory chips having the use value greater than a reference value is smaller than a threshold value, and
operate the plurality of memory chips in the storage mode when a number of memory chips having the use value greater than the reference value is equal to or greater than the threshold value.

6. The nonvolatile memory module of claim 1, wherein the plurality of memory chips and the spare chip include a plurality of resistive memory cells, each of which has a resistance varying based on a logic level of a stored data.

7. The nonvolatile memory module of claim 1, wherein the plurality of memory chips, the spare chip, and the module controller are on the PCB according to a nonvolatile dual in-line memory module (NVDIMM) standard.

8. An electronic device, comprising:
a nonvolatile memory module including,
a plurality of memory chips on a printed circuit board (PCB), each of the plurality of memory chips including a plurality of nonvolatile memory cells,
a spare chip on the PCB and configured to include a plurality of nonvolatile memory cells, the spare chip configured to perform different functions according to operation modes of the plurality of memory chips, and
a module controller on the PCB, the module controller configured to control operations of the plurality of memory chips and the spare chip;
a central processing unit (CPU); and
a memory controller configured to control operations of the nonvolatile memory module under a control of the CPU,
wherein the plurality of memory chips are configured to operate in a memory mode, in which the plurality of memory chips are used as a working memory area that temporarily stores data for an operation of the nonvolatile memory module, and a storage mode, in which the plurality of memory chips are used as a data storage area that preserves data, the storage mode being independent from the memory mode,
when the plurality of memory chips are configured to operate in the memory mode, the spare chip is configured to store an error check and correction (ECC) code for data stored in the plurality of memory chips, and
when the plurality of memory chips are configured to operate in the storage mode, the spare chip is configured to store metadata of the plurality of memory chips, the metadata including validity information as to whether each of the plurality of nonvolatile memory chips is in an activated state or in an deactivated state.

9. The electronic device of claim 8, wherein, when the plurality of memory chips operate in the memory mode,
the memory controller is configured to provide write data and an ECC code for the write data to the module controller, and
the module controller is configured to
store the write data in at least one of the plurality of memory chips, and
store the ECC code in the spare chip.

10. The electronic device of claim 8, further comprising:
a solid state drive (SSD) device coupled to the CPU,
wherein when the plurality of memory chips operate in the storage mode, the memory controller is configured to provide cache data for data stored in the SSD device to the module controller, and the module controller is configured to store the cache data in the spare chip.

11. The electronic device of claim 8, wherein, when the plurality of memory chips operate in the storage mode, the spare chip is configured to be deactivated.

12. A nonvolatile memory device, comprising:
a plurality of memory chips each including a first plurality of nonvolatile memory cells;
a spare chip including a second plurality of nonvolatile memory cells, the spare chip configured to perform different functions according to operation modes of the plurality of memory chips; and
a controller configured to select one of the operation modes of the plurality of memory chips,
wherein the operation modes of the plurality of memory chips includes a memory mode, in which the plurality of memory chips are used as a working memory area that temporarily stores data for an operation of the nonvolatile memory device, and a storage mode, in which the plurality of memory chips are used as a data storage area that preserves data, the storage mode being independent from the memory mode,
when the plurality of memory chips are configured to operate in the memory mode, the spare chip is configured to store an error check and correction (ECC) code for data stored in the plurality of memory chips, and
when the plurality of memory chips are configured to operate in the storage mode, the spare chip is configured to store at least one of metadata of the plurality of memory chips, parameters for an operation of a processor, or cache data for data stored in a SSD device, the metadata including validity information as to whether each of the plurality of nonvolatile memory chips is in an activated state or in a deactivated state.

13. The nonvolatile memory device of claim 12, wherein the controller is configured to select the one of the operation modes of the plurality of memory chips from among the memory mode and the storage mode based on at least one of configuration information received from an external source or an endurance level of the plurality of memory chips.

* * * * *